United States Patent [19]

Koike

[11] Patent Number: 4,532,439
[45] Date of Patent: Jul. 30, 1985

[54] MOSFET LOGICAL CIRCUIT WITH INCREASED NOISE MARGIN

[75] Inventor: Hideharu Koike, Yokohama, Japan

[73] Assignee: Tokyo Shibaura Denki Kabushiki Kaisha, Japan

[21] Appl. No.: 528,781

[22] Filed: Sep. 2, 1983

[30] Foreign Application Priority Data

Sep. 13, 1982 [JP] Japan .................. 57-158144

[51] Int. Cl.$^3$ ............ H03K 19/094; H03K 3/353; G11C 11/40; H03B 5/36
[52] U.S. Cl. ..................... 307/450; 307/451; 307/279; 331/108 D; 331/114; 365/156; 365/181; 365/182; 365/188
[58] Field of Search ............... 307/279, 290, 450, 451; 365/156, 181, 182, 188, 190; 331/108 D, 114, 108 A

[56] References Cited

U.S. PATENT DOCUMENTS

| | | | |
|---|---|---|---|
| 3,855,549 | 12/1974 | Heuner et al. | 307/451 X |
| 3,873,856 | 3/1975 | Gerlach et al. | 307/290 X |
| 3,984,703 | 10/1976 | Jorgensen | 307/279 |
| 4,023,122 | 5/1977 | Oura | 307/279 X |
| 4,103,187 | 7/1978 | Imamura | 307/279 X |
| 4,122,360 | 10/1978 | Kawagai et al. | 307/450 X |
| 4,130,892 | 12/1978 | Gunckel et al. | 307/279 X |
| 4,464,587 | 8/1984 | Suzuki et al. | 307/451 X |

FOREIGN PATENT DOCUMENTS 5651542 8/1976 Japan .
53-18377 2/1978 Japan ......................... 307/451

Primary Examiner—Larry N. Anagnos
Attorney, Agent, or Firm—Finnegan, Henderson, Farabow, Garrett & Dunner

[57] ABSTRACT

A logic circuit comprises a first and second circuit. The first circuit consists of at least one first conductivity-type MOSFET having a gate connected to an input terminal, and having a first current path connected at one end to an output terminal. The second circuit consists of at least one second conductivity-type MOSFET having a gate is connected to the input terminal, and having a second current path connected at one end to the output terminal. The logical circuit further comprises a depletion-type MOSFET of the second conductivity type and a depletion-type MOSFET of the first conductivity type. The depletion-type MOSFET of the second conductivity type has a threshold voltage the absolute value of which is larger than that of the first conductivity-type MOSFET, has a current path connected between the other end of the first current path and a first power source, and has a gate connected to the output terminal. The depletion-type MOSFET of the first conductivity type has a threshold voltage the absolute value of which is larger than that of the second circuit, has a current path connected between the other end of the second conductivity-type MOSFET and a second power source, and has a gate connected to the output terminal.

8 Claims, 9 Drawing Figures

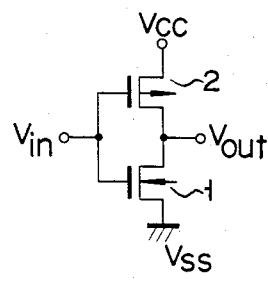
FIG. 1
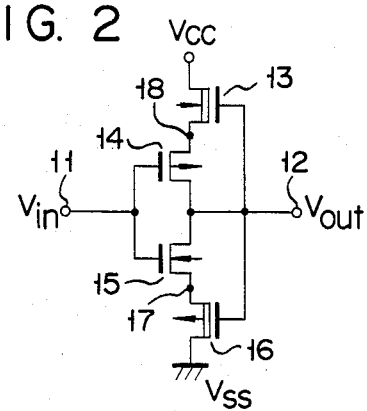
FIG. 2
FIG. 3
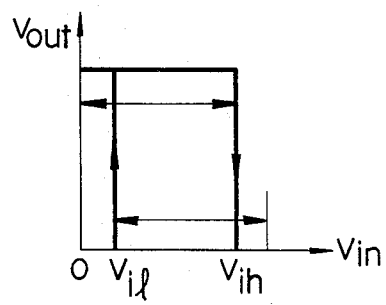
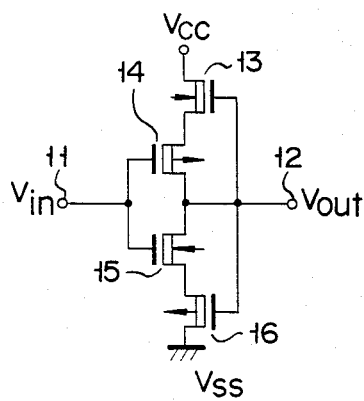
FIG. 4
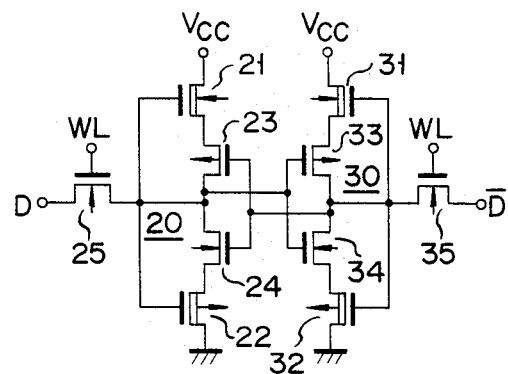
FIG. 5

MOSFET LOGICAL CIRCUIT WITH INCREASED NOISE MARGIN

BACKGROUND OF THE INVENTION

This invention relates to a logical circuit of the CMOS type, having a large power voltage margin and a large noise margin.

For example, a circuit such as that shown in FIG. 1 is known as an inverter circuit in a conventional CMOS logical circuit. Thus, the source and drain of an n-channel MOS transistor 1 are interposed between a power voltage $V_{ss}$ and an output terminal $V_{out}$. A p-channel MOS transistor 2 is interposed between the output terminal $V_{out}$ and the power voltage $V_{cc}$. Both gates of each of the n and p-channel MOS transistors 1, 2 are commonly connected to an input terminal $V_{in}$.

Assuming that a power voltage $V_{cc}$ is 5 V and another power voltage $V_{ss}$ is 0 V, when the input terminal $V_{in}$ is 0 V, transistor 1 is turned off and transistor 2 is turned on, so that the power voltage $V_{cc}$ of 5 V is output from the output terminal $V_{out}$. Assuming that the input terminal $V_{in}$ is 5 V, transistor 1 is turned on and transistor 2 is turned off, a power voltage $V_{ss}$ of 0 V will be output from the output terminal $V_{out}$.

In such an inverter circuit, a power voltage margin $V_{margin}$ is the absolute value of the difference between the maximum voltage value $V_{ccmax}$ to be determined by the breakdown voltage of the circuit and the minimum voltage value $V_{ccmin}$ at which the normal operation can be performed or, in other words $$V_{margin} = |V_{ccmax} - V_{ccmin}|.$$

In the above equation, it is generally impossible to increase the maximum voltage $V_{ccmax}$ since, to do so, it would be necessary to change the structure of the transistor.

On the other hand, the minimum voltage value $V_{ccmin}$ and threshold voltages $V_{thn}$, $V_{thp}$ must theoretically satisfy the conditions represented by the following inequality;

$$V_{ccmin} > max(|V_{thn}|, |V_{thp}|).$$

Therefore, it is desirable to reduce the threshold voltages $V_{thn}$, $V_{thp}$ of transistors 1 and 2 and to enlarge the power voltage margin $V_{margin}$. However, the values of the threshold voltages $V_{thn}$ and $V_{thp}$ are generally set at about 1 V since, due to limitations of process manufacturing technology, they cannot be greatly reduced.

On the contrary, reduction of the threshold voltages $V_{thn}$ and $V_{thp}$ would cause the output to be easily inverted, due to a noise which exceeds these values, so that the noise margin would be decreased and a malfunction might easily occur.

In other words, since enlargement of the power voltage margin and enlargement of the noise margin are mutually opposite conditions, it would be extremely difficult to satisfy both simultaneously.

SUMMARY OF THE INVENTION

A primary object of the present invention is to provide a logical circuit by which a large noise margin can be obtained without reducing the power voltage margin.

Another object of the present invention is to provide a logical circuit which has hysteresis characteristics during the exchange of an output signal level for an input signal level, and which can operate stably.

According to the present invention, a logical circuit is provided which has not only a large power voltage margin, but, also, a large noise margin. The circuit has hysteresis characteristics which are between changes of input and output signal levels and can stably operate.

BRIEF DESCRIPTION OF THE DRAWINGS

FIG. 1 is a circuit diagram showing an example of a conventional inverter;

FIG. 2 is a circuit diagram showing an inverter in an embodiment of the present invention;

FIG. 3 is a diagram showing the input and output characteristics of the inverter shown in FIG. 2;

FIG. 4 is a circuit diagram showing an inverter in another embodiment of the present invention;

FIG. 5 is a circuit diagram showing a memory circuit in another embodiment of the present invention;

DETAILED DESCRIPTION OF THE PREFERRED EMBODIMENTS

Figure 6:
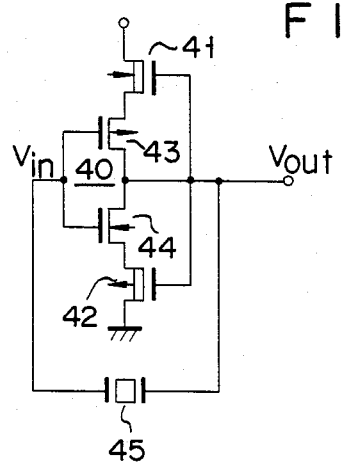
FIG. 6 is a circuit diagram showing an oscillator in another embodiment of the present invention.

An embodiment of the present invention may now be described with reference to the drawings.

FIG. 2 is a circuit diagram showing an inverter in an embodiment of the present invention, wherein reference numeral 11 indicates an input terminal and numeral 12 denotes an output terminal. An n-channel MOSFET 13 of the depletion type and a p-channel MOSFET 14 of the enhancement type, constituting a first circuit, are connected in series, MOSFETs 13 and 14 being interposed between a first power supply, i.e., power source $V_{cc}$, and the output terminal 12. N-channel MOSFET 15 of the enhancement type, constituting a second circuit, and a p-channel MOSFET 16 of the depletion type are connected in series, MOSFETs 15 and 16 being interposed between the output terminal 12 and a second power supply, i.e., power source $V_{ss}$. The gates of each of the depletion-type MOSFETs 13 and 16 are commonly connected to the output terminal 12. The gates of each of the enhancement-type MOSFETs 14 and 15, which constitute the first and second circuits, are commonly connected to the input terminal 11.

With such a construction, when a gate voltage of the n-channel MOSFET 15 is caused to exceed the voltage level at which the threshold voltage was added to the source voltage, by gradually increasing an input voltage $V_{in}$ from 0 V, the charge flows from the output terminal 12, through MOSFET 15 and to its source side, thereby charging a nodal point 17 at the series connection point of MOSFETs 15 and 16. The electric potential $V_{17}$ at this nodal point 17 is represented by the following equation (1):

$$V_{17} = V_{in} - V_{thn}, \qquad (1),$$

wherein, $V_{thn}$ indicates the threshold voltage of MOSFET 15, e.g., 0.8 V. When the voltage at this nodal point $V_{17}$ satisfied the condition of inequality (2) shown below, MOSFETs 15 and 16 are turned on, causing the output voltage $V_{out}$ to be reduced.

$$V_{17} > V_{out} - V_{thpd} \qquad (2)$$

As shown above, $V_{thpd}$ indicates the threshold voltage of MOSFET 16.

On the other hand, when the output voltage $V_{out}$ is decreased, the resistance of MOSFET 13 is increased and the resistance of MOSFET 16 is decreased, so that the output voltage $V_{out}$ is further decreased and finally comes to equal the $V_{ss}$ voltage, i.e., 0 V. At this time, MOSFETs 13 and 14 are cut off.

As described above, when the input voltage $V_{in}$ is gradually increased from 0 V, as shown in FIG. 3, the output voltage $V_{out}$ is inverted from 5 V, corresponding to logic "1", to 0 V, corresponding to logic "0", at a certain potential, or, more specifically, to a turnover voltage $V_{ih}$.

The turnover condition of this output voltage $V_{out}$ is one in which the MOSFET 16 is turned on, so that the input voltage $V_{in}$ at this time becomes the turnover voltage $V_{ih}$. Therefore, the following equation (3) is obtained from expressions (1) and (2):

$$V_{in} - V_{thn} = V_{out} - V_{thpd}. \qquad (3)$$

Since the output voltage $V_{out}$ has logic "1", i.e., $V_{cc}$, the following equation (4) is obtained by modifying equation (3):

$$V_{ih} = V_{cc} + V_{thn} - V_{thpd}. \qquad (4)$$

Therefore, the turnover voltage $V_{ih}$ may be represented by equation (4). The noise margin $N_l$ for the logical value "0" of the input voltage $V_{in}$ is equal to the turnover voltage $V_{ih}$. When the power voltage $V_{cc}$ is set higher, this turnover voltage $V_{ih}$ is elevated, as a result. Thus, when the threshold voltage $|V_{thn}|$ is set lower, a larger noise margin can be obtained. Of course, in this case, the power voltage $V_{cc}$ must satisfy the relationship wherein $V_{cc} > |V_{thn}|$.

On the other hand, when the input voltage $V_{in}$ is gradually reduced from the level of the power voltage $V_{cc}$, and if the gate voltage of MOSFET 14 is lower than the voltage at which the absolute value of the threshold voltage of MOSFET 14 was subtracted from its source potential, then the potential $V_{18}$ at the nodal point 18, which is a series connection point of MOSFETs 13 and 14, may be represented by the following equation (5).

$$V_{18} = V_{in} - V_{thp} \qquad (5)$$

In the above equation, $V_{thp}$ indicates the threshold voltage of MOSFET 14, e.g., $-0.8$ V. When the voltage at this nodal point $V_{18}$ satisfies the following condition of the inequality (6), MOSFETs 13 and 14 are turned on, causing the output voltage $V_{out}$ to increase.

$$V_{18} < V_{out} - V_{thnd} \qquad (6)$$

In the above equation, $V_{thnd}$ indicates the threshold voltage of MOSFET 13.

However, the increase in the output voltage $V_{out}$ increases the resistance of MOSFET 16 and decreases the resistance of MOSFET 13, so that the output voltage $V_{out}$ further increases and finally reaches the level of power voltage $V_{cc}$, i.e., 5 V. At this time, MOSFETs 15 and 16 are cut off. In this case as well, when the input voltage $V_{in}$ is gradually reduced from 5 V, as shown in FIG. 3 until it reaches a turnover potential $V_{il}$, the output voltage $V_{out}$ is turned over from 0 V to 5 V. Since the input voltage $V_{in}$ when MOSFET 13 is turned on equals the turnover potential $V_{il}$, the following equation (7) may be obtained from expressions (5) and (6).

$$V_{in} - V_{thp} = V_{out} - V_{thnd} \qquad (7)$$

In the above equation, by substituting the conditions $V_{in} = V_{il}$ and $V_{out} = 0$ mentioned previously, in which MOSFET 13 is turned on, for equation (7), the following equation (8) is obtained.

$$V_{il} = V_{thp} - V_{thnd} \qquad (8)$$

The noise margin $N_h$ for the logical value "1" of the input voltage $V_{in}$ is represented by the following equation (9).

$$N_h = V_{cc} - V_{il} = V_{cc} - V_{thp} + V_{thnd} \qquad (9)$$

Therefore, the noise margin $N_h$ increases with the power voltage $V_{cc}$ and, when the threshold voltage $|V_{thp}|$ is set smaller, a larger noise margin can be obtained. Of course, in this case, the power voltage $V_{cc}$ must satisfy the relationship wherein $V_{cc} > |V_{thp}|$.

Furthermore, since the turnover voltages $V_{ih}$ and $V_{il}$ are located between voltages 0 and $V_{cc}$, turnover voltage $V_{ih}$ must be smaller than the power voltage $V_{cc}$ and turnover voltage $V_{il}$ must be larger than 0 V. Therefore, the following inequalities (10), (11) must be satisifed from equations (4) and (8).

$$V_{thpd} > V_{thn} \qquad (10)$$

$$|V_{thnd}| > |V_{thp}| \qquad (11)$$

The present invention is not limited to the above embodiments. For example, as shown in FIG. 4, the depletion-type MOSFETs may be used as MOSFETs 14 and 15.

The present invention can be applied to not only the inverter circuit but also, e.g., to a memory circuit such as that shown in FIG. 5. Thus, the first inverter 20 is constituted by depletion-type MOSFETs 21 and 22 and enhancement-type MOSFETs 23 and 24; and the second inverter 30 is constituted by depletion-type MOSFETs 31 and 32 and enhancement-type MOSFETs 33 and 34. The output of the first inverter 20 is connected to the input of the second inverter 30 and, through a first transfer gate 25, to a digit line D. The output of the second inverter 30 is connected to the input of the first inverter 20 and, through a second transfer gate 35, to another digit line $\overline{D}$. The gates of the MOSFETs of the first and second transfer gates 25, 35 are connected to the word line WL, thereby controlling the turning on and off function. The memory circuit thus constituted by such inverters 20 and 30 does not turn over, insofar as the input voltage does not change greatly, since the noise margins of each inverter are great. Therefore, the erroneous writing of data or the like would probably not occur in the memory operation, and a high degree of reliability can be realized.

Figure 7:
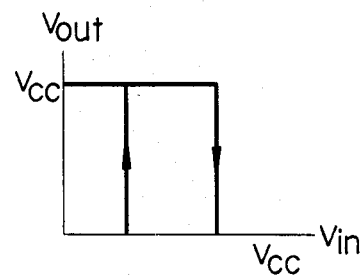
FIG. 7 is a diagram showing the input and output characteristics of the inverter to be used for the oscillator shown in FIG. 6.

The present invention can be also applied to an oscillator such as that shown in FIG. 6. Thus, an inverter 40 may consist of depletion-type MOSFETs 41 and 42 and enhancement-type MOSFETs 43 and 44. A crystal oscillating element 45 would be interposed between the input $V_{in}$ and output $V_{out}$ of this inverter 40. The crystal oscillator using such an inverter 40 has hysteresis characteristics such as those shown in FIG. 7 which emerge as the input and output characteristics of the inverter 40, so that the inverter can be stably operated and a correct oscillation can be obtained.

Moreover, the present invention is not limited to the inverter. For example, it can also be applied to a logical circuit having many inputs, such as the complementary-type NOR circuit shown in FIG. 8, the complementary-type NAND circuit shown in FIG. 9, or the like.

Figure 8:
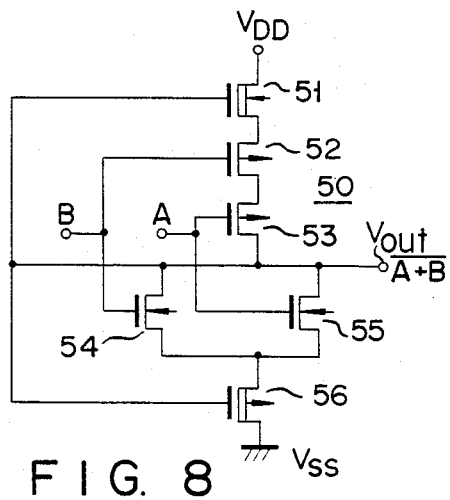
FIG. 8 is a circuit diagram showing a NOR circuit in another embodiment of the present invention.

Thus, in the NOR circuit 50 shown in FIG. 8, enhancement-type MOSFETs 52 and 53 are connected in series to the depletion-type MOSFET 51, said MOSFETs 52, 53 being interposed between the power source $V_{DD}$ and the output $V_{out}$. Two enhancement-type MOSFETs 54, 55 are connected in parallel between this output $V_{out}$ and the power source $V_{ss}$, through the depletion-type MOSFET 56 connected in series. The gates of the MOSFETs 53 and 55 are commonly connected to form input A. The gates of MOSFETs 52 and 54 are commonly connected to form input B. The gates of MOSFETs 51 and 56 are connected to the output $V_{out}$. The OR of the inputs A and B is inverted and output from the output $V_{out}$.

Figure 9:
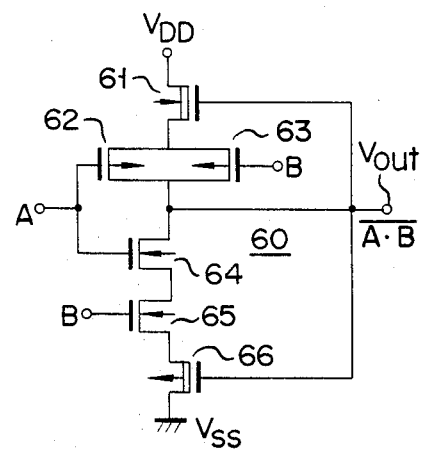
FIG. 9 is a circuit diagram showing a NAND circuit in another embodiment of the present invention.

In the NAND circuit 60 shown in FIG. 9, two enhancement-type MOSFETs 62, 63 are connected in parallel and the pair is connected in series with the depletion-type MOSFET 61, and this series circuit is interposed between the power source $V_{DD}$ and the output $V_{out}$. Enhancement-type MOSFETs 64 and 65 and the depletion-type MOSFET 66 are interposed in series between the output $V_{out}$ and the power source $V_{cc}$. The gates of MOSFETs 62 and 64 are commonly connected to form input A. The gates of MOSFETs 63 and 65 are commonly connected to form input B. Furthermore, the gates of MOSFETs 61 and 66 are respectively connected to the output $V_{out}$. The AND of inputs A and B is inverted and output from the output $V_{out}$.

In the logical circuit of the present invention, since the input and output characteristics exhibit considerable hysteresis. This circuit can also be used as a Schmitt trigger circuit.

As described above, according to the present invention; in the inverter circuit, for example, the noise margin $N_l$ of logical value "0" of input voltage $V_{in}$ is $(V_{cc}+V_{thn}-V_{thpd})$, and the noise margin $N_h$ of logical value "1" of input voltage $V_{in}$ is $(V_{cc}-V_{thp}-V_{thnd})$. These noise margins $N_l$, $N_h$ increase with the power voltage $V_{cc}$. Therefore, the noise margin can be enlarged by increasing the power voltage $V_{cc}$. The minimum power voltage $V_{ccmin}$ is determined in the same manner as in a conventional circuit, in accordance with the following relationship.

$$V_{ccmin} > \max(|V_{thn}51|, |V_{thp}|).$$

What is claimed is:

1. A logical circuit comprising:
    a first circuit consisting of at least one MOSFET of a first conductivity type having a gate connected to an input terminal and having a first current path with one end connected to an output terminal;
    a second circuit consisting of at least one MOSFET of a second conductivity type having a gate connected to said input terminal and having a second current path with one end connected to said output terminal;
    a depletion-type MOSFET of the second conductivity type interposed between another end of said first current path and a first power source, having a gate connected to said output terminal, and having a threshold voltage, the absolute value of which is larger than that of said at least one first conductivity-type MOSFET; and
    a depletion-type MOSFET of the first conductivity type interposed between another end of said second current path and a second power source, having a gate connected to said output terminal, and having a threshold voltage, the absolute value of which is larger than that of said at least one second conductivity-type MOSFET.

2. A logical circuit according to claim 1, wherein said at least one MOSFET in said first and second circuits whose gate is connected to said input terminal is an enhancement-type MOSFET.

3. A logical circuit according to claim 1, wherein said at least one MOSFET in said first and second circuits whose gate is connected to said input terminal is a depletion-type MOSFET.

4. A logical circuit according to claim 1, wherein said first and second circuits form a complementary-type inverter.

5. A logical circuit according to claim 1, wherein said first and second circuits form a complementary-type NOR circuit.

6. A logical circuit according to claim 1, wherein said first and second circuits form a complementary-type NAND circuit.

7. A oscillator circuit comprising:
    a first circuit consisting of at least one MOSFET of a first conductivity type having a gate connected to an input terminal and having a first current path with one end connected to an output terminal;
    a second circuit consisting of at least one MOSFET of a second conductivity type having a gate connected to said input terminal and having a second current path with one end connected to said output terminal;
    a crystal oscillator interposed between said input and output terminals;
    a depletion-type MOSFET of said second conductivity type interposed between another end of said first current path and a first power source, having a gate connected to said output terminal and having a threshold voltage, the absolute value of which is larger than that of said at least one first conductivity-type MOSFET; and
    a depletion-type MOSFET of said first conductivity type, interposed between another end of said second current path and a second power source, having a gate connected to said output terminal and having a threshold voltage, the absolute value of which is larger than that of said at least one second conductivity-type MOSFETS.

8. A memory circuit, including digit lines and a word line carrying a word line signal, comprising:
    a first complementary type MOSFET inverter connected to be powered across first and second power sources, having input and output terminals and including at least one MOSFET of a first conductivity type which has a gate connected to the first inverter input terminal and a first current path with one end connected to the first inverter output terminal;

a second complementary type MOSFET inverter, connected to be powered across said first and second power sources, having input and output terminals and comprising at least one MOSFET of a second conductivity type which has a gate connected to the second inverter input terminal and a second current path with one end connected to the second inverter output terminal, wherein the output terminal of said fist inverter is coupled to the input terminal of said second inverter and the output terminal of said second inverter is coupled to the input terminal of said first inverter;

transfer gate means for coupling said inverter output terminals to said digit lines in accordance with said word line signal;

a depletion-type MOSFET of said second conductivity type interposed between another end of said first current path and a first power source, having a gate connected to said first inverter output terminal and having a threshold voltage, the absolute value of which is larger than that of said at least one first conductivity-type MOSFET; and a depletion-type MOSFET of said first conductivity type, interposed between another end of said second current path and a second power source, having a gate connected to said second inverter output terminal and having a threshold voltage, the absolute value of which is larger than that of said at least one second conductivity-type MOSFET.

* * * * *